(12) United States Patent
Bicker et al.

(10) Patent No.: US 7,399,500 B2
(45) Date of Patent: *Jul. 15, 2008

(54) RAPID PROCESS FOR THE PRODUCTION OF MULTILAYER BARRIER LAYERS

(75) Inventors: Matthias Bicker, Mainz (DE); Stephan Behle, Hahnheim (DE); Lutz Klippe, Weisbaden (DE); Andreas Lüttringhaus-Henkel, Darmstadt (DE); Gregor Arnold, Bodenheim (DE)

(73) Assignee: Schott AG, Mainz (DE)

( * ) Notice: Subject to any disclaimer, the term of this patent is extended or adjusted under 35 U.S.C. 154(b) by 419 days.

This patent is subject to a terminal disclaimer.

(21) Appl. No.: 10/637,779

(22) Filed: Aug. 7, 2003

(65) Prior Publication Data

US 2005/0118428 A1 Jun. 2, 2005

(51) Int. Cl.
*C23C 16/511* (2006.01)
*H05H 1/24* (2006.01)

(52) U.S. Cl. .............. 427/255.7; 427/569; 427/575
(58) Field of Classification Search .......... 427/255.7, 427/575, 569
See application file for complete search history.

(56) References Cited

U.S. PATENT DOCUMENTS

| | | | |
|---|---|---|---|
| 5,437,725 A | | 8/1995 | Schuster |
| 5,654,084 A * | | 8/1997 | Egert .................. 428/215 |
| 5,718,967 A | | 2/1998 | Hu |
| 5,736,207 A * | | 4/1998 | Walther et al. .......... 428/34.7 |
| 6,450,622 B1 * | | 9/2002 | Nguyen et al. ............. 347/63 |
| 6,737,753 B2 * | | 5/2004 | Kumar et al. ............ 257/787 |
| 6,821,825 B2 * | | 11/2004 | Todd et al. .............. 438/150 |
| 6,835,950 B2 * | | 12/2004 | Brown et al. .............. 257/40 |
| 2002/0022156 A1 * | | 2/2002 | Bright ................... 428/698 |
| 2004/0142184 A1 * | | 7/2004 | Behle et al. ............. 428/447 |
| 2004/0229051 A1 * | | 11/2004 | Schaepkens et al. ...... 428/447 |
| 2005/0017633 A1 * | | 1/2005 | Miyadera ................. 313/512 |
| 2005/0284550 A1 * | | 12/2005 | Bicker et al. ............. 148/692 |
| 2006/0051520 A1 * | | 3/2006 | Behle et al. ............. 427/569 |
| 2006/0099340 A1 * | | 5/2006 | Behle et al. ............ 427/248.1 |

FOREIGN PATENT DOCUMENTS

| | | |
|---|---|---|
| DE | 196 34 795 A1 | 3/1998 |
| EP | 0 451 618 A1 | 10/1991 |
| WO | WO 01/94448 A2 | 12/2001 |
| WO | WO 02/10473 A1 | 2/2002 |

\* cited by examiner

*Primary Examiner*—Bret Chen

(57) ABSTRACT

A process for applying alternating layers by chemical vapor deposition comprises the process steps of depositing an adhesion-promoter layer on a substrate and applying a barrier layer. Alternating layers comprising organic and inorganic materials are deposited alternately, and in this process the coating time for application of the adhesion-promoter layer is between 0.05 s and 4.0 s and the coating time for application of the inorganic barrier layer is between 0.1 s and 6.0 s. A composite material is also produced using the process.

32 Claims, 1 Drawing Sheet

RAPID PROCESS FOR THE PRODUCTION OF MULTILAYER BARRIER LAYERS

CROSS-REFERENCES TO RELATED APPLICATIONS

Not applicable.

STATEMENT REGARDING FEDERALLY SPONSORED RESEARCH OR DEVELOPMENT

Not applicable.

BACKGROUND OF THE INVENTION

The invention relates to a rapid process for the application of alternating layers by means of chemical vapor deposition processes, CVD, in particular by means of plasma enhanced chemical vapor deposition PECVD, especially plasma impulse chemical vapor deposition, PICVD, and to coatings which can be applied using this process.

To enable the permeability of packaging for gases and liquids to be reduced and to protect the packaging material from chemical attack or UV radiation, it is advantageous for this packaging to be provided with a barrier coating. In this context, by way of example, the deposition of thin $SiO_x$ coatings or coating systems on polymer substrates is of interest in particular for mass-produced plastics in order to reduce their permeability in particular to oxygen and water vapor and at the same time in particular to maintain the transparency of the material. Moreover, the contents of materials which have been coated in this way can generally be safely heated by means of microwave devices. A further advantage of these coatings lies in the large number of possible options for depositing them on polymer surfaces.

However, to improve the quality of coatings of this type, it is necessary to know the relationship between the barrier action, the morphological properties and the molecular transport through the layer, and in particular to control the influence of the deposition conditions on the coating parameters which result.

TECHNICAL FIELD

Erlat et al., J. Mater. Res., (2000) 15, pp. 704 to 716 presents a model indicating the relationship between the barrier action and the layer morphology and explains the influence of various process parameters.

Erlat et al., J. Phys. Chem. B (1999) 103, pp. 6047 to 6055 describes the morphology of the layers with regard to smooth surfaces on the basis of the aspect of process parameters. However, these last two references only consider individual inorganic barrier layers.

To improve the adhesion properties of $SiO_x$ layers on polymer substrates, Rupertus et al., Fresenius J. Anal. Chem. (1997) 358, pp. 85 to 88 proposes pretreating the substrate in an oxygen plasma.

An improvement to the coating process is carried out in the customary way using the process parameters power, pressure and time.

By initially avoiding oxygen for the first layer, it is possible, in accordance with U.S. Pat. No. 5,718,967 A1, to produce an adhesion-promoter layer in the absence of oxygen and then to produce a protective layer on the adhesion-promoter layer under oxygen excess by the subsequent introduction of oxygen.

EP 709485 describes a process for the multilayer coating of plastic with alternating layers produced from HMDSO and $TiCl_4$. In this process, organic barrier layers are deposited using HMDSO and inorganic barrier layers are deposited using $TiCl_4$. However, this application does not describe how it is possible to achieve rapid process times and how the rapid process can be implemented for containers with a volume of >18 ml, typically >50 ml.

For economic implementation of a barrier coating process on substrates, such as for example PET bottles, it is necessary to achieve very high throughput rates. Typical throughput rates on lines which comprise stretch blow-molding machines for plastic containers and downstream filling installations are 10 000 to 30 000 containers per hour. However, for optimum integration of a barrier coating installation which is arranged in this line in the following order:

1. Stretch blow molding
2. Coating
3. Filling

It is necessary and advantageous to realize a throughput rate which is comparable to or just as high as that achieved for the barrier coating carried out. However, these framework conditions require a very fast barrier coating process in which the pure coating time in which a layer grows on the substrate should be less than 6 s, preferably less than 3.6 s or even less than 1.0 s.

The throughput rate is also dependent on the number of stations required on a coating machine, meaning that the number of stations required can be reduced by very short coating times or alternatively the throughput rate can be increased for the same number of stations, resulting in significant cost benefits.

WO 99/49991 describes a barrier coating comprising amorphous carbon in which a rapid process with coating times in the range from 2 to 3 s is achieved. However, this document does not state how permeation or barrier improvement is achieved compared to the uncoated substrate with a predetermined process time. However, these layers are not transparent, but rather are brownish to yellow in color. However, this coloration is highly unesthetic in particular for transparent containers which are to be coated and often leads to unacceptable results. Although the coloration is reduced if these layers are applied as thin films, it is still present. If the layer thickness is reduced, however, the barrier action significantly deteriorates as a result. Furthermore, these layers of amorphous carbon can only be removed from the PET substrate with very great difficulty and at high cost. For this reason, recycling of the coated containers causes problems, since a certain amount of color may remain in the recycled product even when it is mixed with uncoated PET.

Coating times of 2 to 4 s for an $SiO_x$ barrier layer are also described in patent WO 02/09891 A1 and WO 02/10473. However, these publications do not state the process parameters which can be used to achieve the coating times specified. In particular, there is a lack of precise information as to pressure, concentration, microwave power and precursor flow rates and also carrier and reactive gas flow rates.

Moreover, WO 02/10473 describes a process in which layers from various starting compounds are applied, comprising a protective layer comprising amorphous carbon, an $SiO_x$ layer and a boundary layer toward the substrate produced from oxygen and an "organo-silicon-containing" compound. This process is highly complex, since a total of three layers are applied and very divergent starting compounds have to be used. Claims 1-10 of WO 02/09891 A1 also describe a similarly complex process.

SUMMARY OF THE INVENTION

Working on the basis of the known processes described above, it is an object of the invention to provide a process, which can be optimally integrated in a production line, for applying high-quality barrier layers to a substrate, such as for example to the inner surface of a plastic bottle.

This object is achieved in a surprisingly simple way by of a process for applying alternating layers by chemical vapor deposition, which comprises the process steps of depositing an organic adhesion-promoter layer on a substrate and of applying an inorganic barrier layer, alternating layers of organic and inorganic materials being deposited alternately, and an organic adhesion-promoter layer being applied as a first layer and an inorganic barrier layer being applied as a second layer, in which process the coating time for application of the organic adhesion-promoter layer meets one or more of the following times: between 0.05 s and 4.0 s and/or the coating time for application of the inorganic barrier layer is between 0.1 s and 6.0 s. Furthermore, the invention describes a process wherein the deposition rate for the organic layer is in the range from 120 nm/min to 5000 nm/min, preferably in the range from 500 nm/min to 2000 nm/min, and/or the deposition rate for the inorganic layer is in the range from 60 nm/min to 2000 nm/min, preferably in the range from 100 nm/min to 1000 nm/min. gives a composite material which can be produced using the process according to the invention.

The Applicant has already proposed a process for producing a composite material with an improved barrier action and improved adhesion in application PCT/EP/02 08 853 entitled "Composite material comprising a substrate material and a barrier layer material". Reference is made to this application PCT/EP/02 08 853 and its content is hereby incorporated in its entirety by reference in the present application and also in any subsequent protected right derived therefrom.

In the process according to the invention, alternating layers are produced from just one precursor material or from two silicon-containing precursor materials. This allows a procedure which is rapid and simple to implement and which also in particular allows the rapid process times described above.

A transition between organic and inorganic layers can be made variable, and moreover it is possible to apply very smooth layers, the barrier action being strengthened by the interfaces between organic and inorganic layers.

The invention provides for the overall flow rate for the second, inorganic layer to be greater than or equal to the overall flow rate for the first, organic adhesion-promoter layer. In the latter case, it is then advantageously possible to significantly increase the deposition rate for the second layer, so that the overall coating time can be reduced further. Increase in the overall flow rate with a low precursor concentration makes it possible to maintain the quality of the barrier layer and, at the same time, to significantly increase the deposition rate, so that a significantly reduced coating time becomes possible for the second inorganic barrier layer while maintaining the same layer thickness.

Therefore, the solution according to the invention for the first time provides a process for providing alternating layers, i.e. at least two layers, by CVD, preferably PECVD, in particular PICVD processes which comprises the process steps of rapid deposition of an adhesion-promoter layer on a substrate and application of a barrier layer, with alternating layers of organic and inorganic materials being deposited alternately. It is preferable for only two layers to be deposited. This makes it possible to achieve particularly fast process times.

The alternating layers may advantageously be deposited from only a single precursor gas or from two similar silicon-containing organic precursor gases, such as for example hexamethyldisiloxane or hexamethyldisilazane for both layers or hexamethyldisiloxane for the first, organic layer and hexamethyldisilazane for the second, inorganic layer.

The process is distinguished by the fact that the coating time for application of the adhesion-promoter layer is between 0.05 s and 4 s and/or the coating time for application of the barrier layer is between 0.1 s and 6 s. In this context, the term "coating time" means the duration of time within which a layer is deposited on the substrate and during which a continuous or pulsed plasma is burning.

For efficient production of barrier layers, in particular on dielectric materials, it is necessary to deposit smooth layers with a low density at inner boundary surfaces or other inhomogeneities. A high density of topological or chemical inhomogeneities may lead to an increased layer permeability.

This is the case in particular if there are short diffusion paths, through which rapid diffusion in relation to the volume can take place, along the inhomogeneities. By way of example, with very porous layers it is not generally possible to achieve a good barrier action. Therefore, layers with a low density of short diffusion paths, such as for example amorphous layers with a low density of inner boundary surfaces and/or polycrystalline layers with a low density of grain boundaries, are preferred.

With alternating layers, the diffusion through the boundary surfaces between organic and inorganic layers is significantly inhibited or the diffusion path is significantly lengthened.

Both very smooth inorganic layers and very smooth organic layers can be deposited by means of suitably selected process parameters. In the application filed by the Applicant on the same day entitled "Process for producing smooth barrier layers and composite material with smooth barrier layer", bearing the Applicant's reference number 02SGL0184DEP (Application number will be added after the official reference has been obtained), the Applicant proposes a device and a process for producing very smooth barrier alternating layers. Reference is hereby made to this application in its entirety.

To enable the very rapid process in accordance with the invention to be carried out in a simple way, the alternating layers according to the invention are deposited by varying at least one process parameter.

The inventors have discovered that by using a plasma enhanced CVD process, in particular a so-called PICVD process, it is possible to deposit layers with particularly good adhesion and with an excellent barrier action within a very short process time. The PICVD technique can be used to apply very thin layers to a substrate material which, nevertheless, have very good barrier properties. In addition, the layers have a high flexibility.

The use of a PICVD process also enables the process to be employed on multistation installations, which in particular allows a high throughput.

In the process according to the invention, it is advantageous for a plasma which is generated by means of microwaves to be used for deposition of the layers. In this context, it is preferable to use microwaves with a frequency of 2.45 GHz. Moreover, there is provision for the plasma generated by means of microwaves to be pulsed.

An increased overall flow rate causes the flow profile in the container to change. It has been found that, depending on the gas flow rate in particular for the inorganic barrier layer, it is possible to advantageously adapt the lance length by means of which the precursor gas has been introduced into the container to be coated, in order to be able to achieve a uniform distribution of the components in the process gas inside the container. The lance length is in this case defined as the distance between the opening from which gas flows into the container to be coated and the outer edge of the container opening of the container which is to be coated, which is sealed with respect to the atmosphere. During this adapting, the layer thickness distribution for the organic layer is only altered slightly.

In addition to the lance length, the invention also provides for the interpulse period to be adapted to an increased overall flow rate. In this case, the interpulse period is shortened for a higher overall flow rate.

The interpulse period determines the time within which fresh process gas can flow into the container before a plasma is ignited and the coating takes place. With an optimized flow with regard to the pressure, the overall flow rate, the precursor concentration, the lance length and the nozzle diameter, it is possible to achieve a good distribution of the components of the process gas even with relatively short interpulse periods and in this way to accelerate the process sequence still further.

It should be noted that when using pulsed plasmas, the deposition rate does not necessarily have to be lower than when using what are known as "continuous wave plasmas (CW plasmas)", since if suitably determined parameters are used for the pulsed plasma virtually complete conversion of materials can take place within the pulse length and new fresh gas which is once gain virtually completely converted during the next pulse flows in during the interpulse period.

The deposition rate achieved with pulsed plasmas may even be higher if the fresh process gas flows in at the right time and then a higher quantitative conversion of materials takes place during the pulse with a high pulse power than in the case of a CW plasma with a lower instantaneous power. With a shorter interpulse period, the deposition rate increases significantly up to an optimum, since the proportion of unconverted precursor gas rises until saturation point is reached.

In accordance with the invention, the deposition rate for the organic layer is in the range from 120 nm/min to 5000 nm/min, preferably in the range from 500 nm/min to 2000 nm/min, and/or the deposition rate for the inorganic layer is in the range of 60 nm/min to 2000 nm/min, preferably in the range from 100 nm/min to 1000 nm/min.

Consequently, by shortening the interpulse period, it is possible to achieve a significantly shorter coating time, with an optimum level being formed, since if the interpulse period is too short the uniformity of the coating becomes inadequate, on account of the fact that it is impossible to form a uniform distribution of the components of the process gas.

The uniformity is defined as the ratio of the minimum layer thickness to the maximum layer thickness, the values being determined by measurement over the abovementioned substrate.

On the other hand, if the interpulse period is too long, the proportion of unconsumed process gas rises. In accordance with the invention, the lance length is reduced as the overall flow rate increases. The lance length is from 5% to 80%, preferably from 10% to 50%, of the height of a hollow body which is to be coated.

A further advantage of the pulsed plasma is that it is possible to produce very pure inorganic barrier layers, since unlike with the CW plasma, undesirable organic reaction products can be removed in the interpulse period and consequently a significantly reduced proportion of organic constituents is incorporated in the layers.

In addition to the above-mentioned benefits of the PICVD process, the possibility is therefore afforded of providing further process parameters for controlling the process of rapid deposition of alternating layers from a single precursor gas or two similar silicon-containing precursor compounds.

The at least one process parameter which is to be varied is selected from the group consisting of the precursor concentration, the mean microwave power, the pressure, the pulse power, the pulse length, the duration of the interpulse period and the overall flow rate. These parameters make it possible to deposit high-quality barrier layers despite using a very short coating time. All the process parameters mentioned refer to the coating of an individual substrate. For the coating of a large number of substrates in a multiposition installation, for example a rotary or batch installation with a plurality of chambers, the parameters mentioned in each case refer to the coating in an individual chamber.

For the organic layer, optimum interpulse periods have proven to be in the range from 2 ms to 100 ms, preferably between 5 ms and 60 ms, and for the inorganic layer have proven to be between 5 ms and 200 ms, preferably between 20 ms and 50 ms.

In accordance with the invention, the parameters are set to optimum values for this purpose.

In particular, there is provision for the precursor concentration for application of the first, organic adhesion-promoter layer to be in the range from 5% to 80% of the overall flow and/or for the precursor concentration for application of the second, inorganic barrier layer to be in the range from 0.5% to 4%, preferably between 0.8% and 3%, of the overall flow.

Furthermore, there is provision for the pulse power for the organic layer to be in the range from 100 W to 5000 W, preferably in the range from 400 W to 1500 W, and/or for the pulse power for the second, inorganic layer to be in the range from 100 W to 5000 W, preferably in the range from 400 W to 1500 W.

In accordance with the invention, the mean microwave power for the organic layer is in the range from 10 W to 5000 W, preferably in the range from 10 W to 500 W, and/or for the inorganic layer is in the range from 10 W to 5000 W, preferably in the range from 30 W to 2000 W.

The barrier coating may also particularly advantageously have a structure or composition which varies perpendicular to the coated surface of the substrate. The variation may in this case be continuous or stepped.

A stepped variation results in a multilayer barrier coating. By way of example, the bottom layer, which is in contact with the surface of the substrate, can be used as an adhesion-promoter layer for the subsequent coatings. Layers or layer systems of this type can be produced, for example, by a continuous or stepped change in the precursor concentration during the coating.

Particularly good coating properties can in this case be achieved with multiple alternating layers, known as multilayers.

The substrate material which is to be coated may also in particular comprise a hollow body. Therefore, the process according to the invention makes it possible to deposit a coating on the inner side and/or the outer side of the hollow body.

The application which the Applicant of the present application filed with the German Patent and Trademarks Office on the same date, entitled "Process for producing smooth barrier layers and composite material with smooth barrier layer", Applicant's reference 02SGL0184DEP, describes a device for applying barrier layers to hollow bodies as substrate. Reference is hereby made to the disclosure of this application in its entirety, and the content of this application is hereby incorporated by reference in its entirety in the subject matter of the present application.

The invention also advantageously provides for a hollow body as substrate to be, preferably simultaneously, evacuated on the outer side to a pressure $P_1$ and pumped out to a base pressure $P_2<P_1$ on the inner side, the pressure $P_1$ in particular being around 50 mbar and the base pressure $P_2$ in particular being less than 0.1 mbar.

Furthermore, for the process according to the invention, there is provision for a gas mixture which contains the precursor to be passed into the interior of the substrate at a pressure $P_3$, where $P_2<P_3<P_1$, the pressure $P_3$, in particular for the first, organic layer, being in the range from 0.1 mbar to 1.0 mbar, preferably in the range from 0.2 mbar to 0.5 mbar, and for the second, inorganic layer being in the range from 0.1 mbar to 1.0 mbar, preferably in the range from 0.25 mbar to 0.6 mbar. The advantageous result of this is that the pressure differences which act on the walls of the hollow body are not excessive, which could lead to deformation of the hollow body in the case of thin-walled material.

Furthermore, to coat exclusively the inside, it may be advantageous for the external pressure to be selected in such a way that no plasma is ignited in the exterior. To avoid high pressure differences even during the pumping-out operation, it is advantageously possible initially for the pumping-out operation to be carried out uniformly, so that the above-mentioned external pressure is reached, and then for only the inside to be pumped out further until a base pressure within the range described is reached.

In the process, it is advantageous for the overall flow rate and/or the pressure $P_3$ in the interior of the substrate during deposition of the inorganic barrier layer to be at least equal to and in particular higher than the overall flow rate and/or the pressure $P_3$ in the interior of the substrate during deposition of the organic adhesion-promoter layer. Therefore, the invention makes it possible to achieve a significantly higher deposition rate during application of the inorganic barrier layer than with a lower overall flow rate.

In accordance with the invention, the process gas for a layer is admitted at a pressure $P_4$ which is higher than the pressure $P_5$ immediately prior to the ignition of the plasma. In this way, the filling operation can be carried out quickly and efficiently. During the application of a layer, the process pressure then drops continuously until the start of the application of the next layer, and the temperature rises continuously during the application of the coating.

In accordance with the invention, the overall flow rate for the organic adhesion promoter layer is in the range from 10 sccm to 250 sccm, preferably in the range from 40 sccm to 100 sccm, and for the inorganic layer is in the range from 200 sccm to 1000 sccm, preferably in the range from 250 sccm to 400 sccm.

Moreover, the process is distinguished by the fact that as the process parameters change during the transition between two coating steps, the plasma either continues to burn or is interrupted for a transition time. As a result, the invention makes it possible to achieve a smooth, continuous transition in the form of a gradient or a sudden transition in the form of a step and, furthermore, makes it possible to save energy. In particular, the transition time for a pulsed plasma is greater than the interpulse period.

The process according to the invention in principle obviates the need for a pretreatment of the substrate. In the case of particularly critical substrates which consist, for example, of a material to which the adhesion of the coating is unsatisfactory, however, it is also possible, according to the present process, for a plasma pretreatment to be carried out prior to the application of the coating. In order nevertheless to ensure that the high speed of the process according to the invention is not reduced as a result, the duration of the plasma pretreatment is less than 5 s, preferably less than 1 s.

To widen the possible options for process control and to make it possible to exploit synergistic effects, there is furthermore provision for a combination of process parameters to be varied.

Depending on the demands imposed on the coating, the process according to the invention can be used to produce layers with different properties. For example, one requirement may be the production of defined boundary surfaces in the coating, in particular for an improved barrier action. Therefore, the solution according to the invention comprises various options for varying the process parameters. The at least one process parameter may be varied continuously or discontinuously, or alternatively the at least one process parameter may be varied in part continuously and/or in part discontinuously.

In the case of the process according to the invention, it is advantageous first of all to deposit an organic layer on the substrate as an adhesion-promoter layer. This allows improved adhesion of further layers, in particular of a barrier layer.

The pecursor is fragmented during the deposition of the adhesion-promoter layer. Suitable selection of the process parameters influences the fragmentation of the precursor in such a manner that individual fragments in the form of atoms, molecules, ions or free radicals react with the molecules of the substrate which is to be coated and form a chemical bond (chemisorption). This bonding is preferred to physisorption. The strong bonding resulting from the fragmentation of the precursor improves the layer adhesion. The fragmentation in particular results in the formation of an organic adhesion-promoter layer with a carbon content of more than 10%.

Furthermore the process parameters influence the growth of the adhesion-promoter layer in such a manner that the organic layer is advantageously deposited on the substrate by individual layer growth and has only a few defects in the form of inner boundary surfaces. The adhesion-promoter layer is therefore very smooth and can even itself have a barrier action, since it has only a very small number of boundary surfaces which could serve as paths for rapid diffusion.

In addition, under suitable conditions it is possible to use the adhesion-promoter layer to achieve a smoothing effect on a rough plastic substrate. In this context, reference is made to the entirety of the application 02SGL0184DEP in the name of the Applicant. One advantage of the smooth adhesion-promoter layer is that an inorganic layer with a good barrier action can be applied to it, whereas with adhesion-promoter layers with a rough morphology it is only possible to apply an inorganic layer with a significantly reduced barrier action. The inorganic barrier layer used is sufficient for good layer adhesion even in the case of nonpolar plastics, such as for example polypropylene. One process engineering advantage in this context is that the process according to the invention does not require a time-consuming plasma pretreatment for activation of the surface, as could take place, for example, using an oxygen plasma in accordance with the documents cited above.

In accordance with the process of the invention, an inorganic layer is deposited as barrier layer. This barrier layer advantageously improves the barrier action on account of the boundary surfaces between the organic layers and the dense, likewise smooth inorganic layers. A sudden change in the morphology, for example from individual layer growth to columnar growth or to insular growth, significantly lengthens the diffusion paths along the boundary surfaces. Moreover, bonding conditions are different at the boundary surfaces than in the interior of the layers, making permeation more difficult in these regions.

The process according to the invention can be carried out using various precursors; in particular, there is provision for the gas mixture to contain oxygen and at least one precursor selected from the group consisting of organic silicon-containing or metal-containing organic compounds, in particular HMDSN, HMDSO, TMDSO, silane in $N_2$, TEOS or TIPT, or metal chlorides, in particular $TiCl_4$, or silicon chlorides and hydrocarbons, in particular alkanes, alkenes or alkynes, in particular acetylene. Preferred precursors in this case are HMDSN and/or HMDSO.

Repeating the process steps of applying a first layer and a second layer, with the alternating layers being deposited in particular on a dielectric material and/or on plastic, enables the process according to the invention to apply barrier coatings with particularly long diffusion paths, in which case the process can advantageously be used for packaging, in particular plastic packaging.

In addition to the process, the invention also comprises a composite material which comprises alternating layers alternately consisting of organic and inorganic materials which have been deposited from a single precursor gas.

Furthermore, the composite material advantageously has an increased barrier action, an increased adhesion to the substrate, an increased stretchability, an increased mechanical stability under compressive load and/or an increased mechanical stability under stretching load. After stretching and/or plastic deformation involving changes in length of more than 4%, in the case of the composite material according to the invention a barrier improvement remains, with an oxygen barrier improvement factor of greater than 1.5, preferably greater than 2.0.

Another advantage of the composite material is that it has a high mechanical stability in particular under stretching load caused by carbonated liquids under excess pressure. Containers made from the composite material according to the invention are particularly suitable for liquids of this type. Therefore, the coating according to the invention in general offers advantages when it is used in particular on substrates which comprise or form containers for foamed products or products with dissolved gases.

The coating has at least one organic adhesion-promoter layer, the thickness of which is in the range from 1 nm to 200 nm, and at least one inorganic barrier layer with a thickness of from 5 nm to 200 nm.

The invention for the first time makes it possible to produce layer qualities within rapid process times of less 6 s which are so good that even with the layer thicknesses in the range cited the demands imposed on the barrier action, the adhesion, the stretchability and the mechanical stability under compressive load can be fulfilled.

On account of the small layer thicknesses required, a saving on material becomes possible. Moreover, the coating time required is reduced, since the thinner the layer has to be, the shorter the coating time can be selected to be. In this way, the coating according to the invention makes it possible to use a very rapid coating process with a surprisingly high quality of barrier action.

Moreover, the composite material is temperature-resistant. The temperature resistance is defined by the fact that the layers bond and a barrier action is present even after hot filling. Particularly under thermal loads caused by hot filling, therefore, the invention offers the advantage that there is substantially no detachment of the barrier coating caused by the thermal load and that there is still a good barrier action even after the thermal load.

Furthermore, the coating according to the invention has a good resistance to filling with hot liquids, as is required, for example, for HOT-FILL bottles or containers for other products which are used for a hot filling. In these containers too, the process can be implemented within a very short coating time.

In addition to the at least one alternating layer comprising organic and inorganic coating, the composite material may also comprise a covering layer. For example, depending on the demands imposed on the coated substrate, it is possible to provide a protective layer.

Moreover, the covering layer may comprise written markings or other such formations on the coated substrate.

Unlike with the conventional carbon-based process, the composite material according to the invention is substantially transparent. The term "transparent" denotes a layer which is transparent in the visible wavelength region, which means that the visual transmissivity (light type D65) is no lower than for an uncoated bottle. Therefore, the invention can be used to produce containers with which firstly the product can be seen in undistorted form from the outside and which secondly allow the contents to be visually inspected. This may be important for applications in medical technology or biotechnology, for example for photometric measurements.

In the field of food or cosmetic packaging, firstly a transparent packaging is attractive to the consumer, and secondly the contents of such a packaging can be checked for spoiling easily and reliably.

BRIEF DESCRIPTION OF THE DRAWINGS

The invention is described below on the basis of exemplary embodiments and with reference to the appended drawing, in which.

DETAILED DESCRIPTION OF THE INVENTION

First Embodiment

Figure 1:
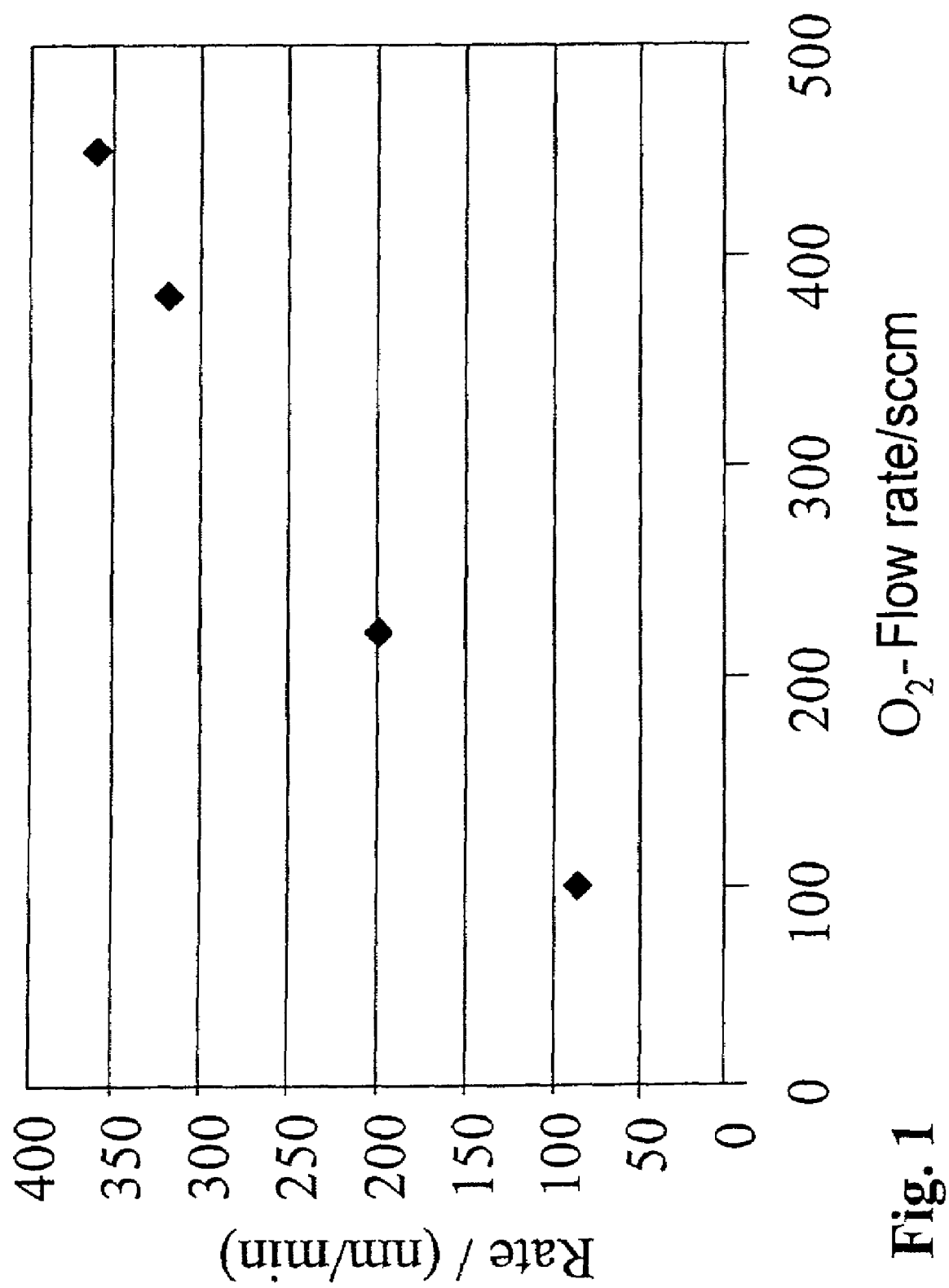
FIG. 1 shows the deposition rate of a second, inorganic barrier layer as a function of the oxygen flow rate.

Internal Coating of a 0.4 l PET Bottle with an Adhesion Promoter/barrier Composite:

A bottle made from polyethylene terephthalate (PET) with a filling volume of 0.4 l is simultaneously evacuated to a pressure of 50 mbar on the outer side and pumped out on the inner side initially to a base pressure of below 0.1 mbar.

Then, a mixture of oxygen and hexamethyldisilazane (HMDSN) is passed into the interior of the bottle at a pressure of 0.3 mbar.

Then, pulsed microwave energy with a frequency of 2.45 GHz is introduced and a plasma is ignited in the container.

First of all, a first, 10 nm thick organic barrier layer is applied within a coating time of less than 1 second, at an HMDSN concentration of 40% and an overall flow rate of 40 sccm.

The pulse power is 800 W, the pulse length preferably 0.7 ms and the interpulse period is 40 ms.

This is followed by a rapid gas change to a lower HMDSN concentration of 1.2%. A second, inorganic barrier layer is applied at the same predetermined pressure.

In screening tests with a constant HMDSN concentration and a constant pressure, the parameters layer thickness and/or coating time and the further process parameters oxygen flow rate and pulse power, pulse length and interpulse period, as well as the installation parameters lance length, are varied in accordance with the statistical test planning method.

FIG. 1 shows a comparison between the oxygen flow rate set and the measured deposition rate.

As the oxygen flow rate increases, the deposition rate of the second, inorganic layer can be considerably improved.

Table 1 shows a selection of process parameters tested for the second, inorganic layer at which the composite comprising the first and second layers results in a high barrier action.

Furthermore, the coating time and deposition rate of the second, inorganic layer are shown as a function of process and installation parameters, as is the characterization of the barrier improvement of the two-layer composite comprising first, organic layer and second, inorganic layer, immediately after the coating and after a load test (creep test using 4% by volume of $CO_2$).

off with a plastic cap. Then, the filled bottles were initially stored at room temperature for 24 hours, followed by 24 hours at 38° C.

In the test procedure, an internal pressure of up to 5 bar was built up in the bottle, resulting in the layer/substrate assembly being locally stretched by more than 4.5% and even leading to plastic deformation. The high level of stretching and/or plastic deformation reduces the barrier improvement, which can be traced to changes in the layer composite in extremely high stretching ranges.

However, the composite is so stable that a readily detectable barrier action is retained despite this high loading. This effect can be attributed to the fact that, despite the high level of stretching and/or plastic deformation, no layer detachment occurs on account of the good adhesion, and for the majority of the surface of the coated substrate no cracks are formed in the layer composite, which would have an adverse effect on the barrier action.

TABLE 1

Coating time and deposition rate of the second, inorganic layer as a function of process Barrier improvement (BIF) of the two-layer composite comprising first, organic coating and second, inorganic coating and after a load test (4% creep test using 4% by volume of $CO_2$).

| Process | Lance length (mm) | Thickness of second layer (mm) | $O_1$ flow rate (sccum) | Pulse power (W) | Pulse length barrier (ms) | Interpulse period barrier (ms) | Coating time (s) | Deposition rate (nm/min) | $O_2$-BIF of two-layer composite | $O_2$-BIF after 4% creep test |
|---|---|---|---|---|---|---|---|---|---|---|
| 1 | 120 | 20 | 100 | 800 | 3 | 50 | 14 | 86 | >40 | 4 |
| 2 | 50 | 20 | 220 | 800 | 3.5 | 40 | 6 | 200 | >40 | 5 |
| 3 | 50 | 17.5 | 380 | 850 | 3.5 | 40 | 3 | 318 | >40 | 5 |
| 4 | 50 | 12 | 450 | 900 | 4 | 40 | 2 | 360 | …30 | 4 |

In the above table, the barrier improvement factor BIF is defined as the ratio of the permeation of an uncoated substrate relative to the permeation of a coated substrate.

It can be seen from the data that in process 1, in which the oxygen flow rate is 100 sccm, the interpulse period is 50 ms and the lance length is 102 mm, a deposition rate of 86 nm/min is achieved.

The coating time is relatively long, at 14 s. By contrast, on account of the higher oxygen flow rates of 220, 380 and 450 sccm and on account of the shortening of the interpulse period to 40 ms and the improved lance length of 50 mm, the deposition rates of processes 2, 3 and 4 are significantly higher, at 200, 318 and 360 nm/min, respectively.

Consequently, the coating time can be significantly reduced. Furthermore, the thickness of the second layer has been reduced in order to further shorten the process time. This has led to an overall reduction in the resulting coating time to from 2 to 6 seconds.

The coating makes it possible to produce an adhesion promoter/barrier composite with a high oxygen barrier improvement factor ($O_2$-BIF), which has a value of significantly over 40 for processes 1, 2 and 3.

The permeation of an uncoated bottle is 0.1955 cm³/(package day bar). The permeation of the coated bottle is so low that the resolution limit of the Mocon-Oxtran measuring device used was reached.

An $O_2$-BIF of 30 was determined for process 4, which had the shortest coating time for the second layer of 2 s.

These layers have very good adhesion and resistance to stretching, as indicated by the following creep test.

For the creep test, the coated bottles were filled with 0.4 l of carbonated liquid with a $CO_2$ content of 4% and were closed The $O_2$-BIF is determined again after the creep test. The determined values are shown in Table 1: processes 2 and 3, which are considerably shorter than process 1, allow a comparably good barrier action, and even a slightly improved barrier action following the creep test, to be achieved compared to process 1.

The fastest process has a slightly reduced but still very high barrier improvement after the coating and just as good a barrier improvement after the creep test as the slower process 1.

Embodiment 2

Alternating Layers Comprising Alternating Organic and Inorganic Layers:

The processes from the first exemplary embodiment are repeated a number of times in order to apply alternating layers comprising alternate organic and inorganic layers.

After an organic barrier layer has been applied, a rapid gas change has taken place and an inorganic barrier layer has been applied, a further gas change takes place, during which the coating parameters of the organic layer are established.

Then, the operation comprising the steps listed is repeated at least once. The alternating layers deposited have a high barrier action and very good mechanical load-bearing properties.

Embodiment 3

Rapid Coating of a HOT-FILL Bottle:

A HOT-FILL bottle made from crystalline PET with a volume of 0.5 l is coated using the same process parameters as used in process 2 from Embodiment 1. In this case, the term HOT-FILL bottles, as is customary, denotes a bottle which can be filled with hot liquid and undergoes substantially no change in size when it is filled with a liquid at a temperature of between 85° C. and 95° C.

However, the deposition rate does change, on account of the altered bottle shape.

To coat the bottle with substantially the same layer thicknesses as in Embodiment 1, the result is a coating time of 1.3 s for the first, organic layer and of 5.3 s for the second, inorganic layer.

Immediately after the coating, the container has a high barrier action. An uncoated HOT-FILL bottle has an oxygen permeation of 0.192 $cm^3$/(package day bar), and a coated bottle has an oxygen permeation below the detection limit of 0.04 $cm^3$/(package day bar) and therefore an $O_2$-BIF of more than 40.

In a load test, coated bottles are initially stored for 1 hour at 35° C. and 95% relative atmospheric humidity. Then, the bottles are filled with water at 95° C. to a level of 0.5 l, the temperature is kept at this level for 5 minutes and then the filled container is cooled to room temperature over 20 minutes in a cold water bath.

After this hot-filling load test, the oxygen permeation of the specimens is determined.

The result in this case is an $O_2$-BIF of 9 following the load test. This test demonstrates that the coating is able to withstand hot filling, since detachment of the layer is not observed and the good barrier action is retained after the hot filling.

Embodiment 4

Rapid Internal Coating of a 0.6 l PP Bottle with an Adhesion Promoter/barrier Composite:

A bottle made from polypropylene (PP) with a filling volume of 0.6 l is coated using the same process parameters as in process 2 from Embodiment 1. The deposition rate changed on account of the altered bottle shape.

In order to coat the bottle with the same layer thicknesses as in Embodiment 1, a coating time of 1 s for the first, organic layer and of 5.6 s for the second, inorganic layer results. The coating makes it possible to produce an adhesion promoter/barrier composite with a high $O_2$ barrier improvement factor ($O_2$-BIF).

The layers adhere very securely and are able to withstand stretching. In the present case, there is no need for a plasma pretreatment or for activation of the substrate, as could take place, for example, with an oxygen plasma.

We claim:

1. A process for applying alternating layers by chemical vapor deposition in order to produce a transparent composite material, which comprises the process steps of depositing an organic adhesion-promoter layer on a transparent substrate and of applying an inorganic barrier layer, alternating layers of organic and inorganic materials being deposited alternately, and an organic adhesion-promoter layer being applied as a first layer and an inorganic barrier layer being applied as a second layer, in which process the coating time for application of the organic adhesion-promoter layer is between 0.05 s and 4.0 s and for application of the inorganic barrier layer is between 0.1 s and 6.0 s and in which said alternating layers are produced from silicon or metal-organic compounds containing precursor materials.

2. The process as claimed in claim 1, wherein the alternating layers are deposited by varying at least one process parameters.

3. The process as claimed in claim 1, wherein a plasma generated by means of microwaves is used for deposition of the layers.

4. The process as claimed in claim 3, wherein the plasma generated by means of microwaves is pulsed.

5. The process as claimed in claim 1, wherein the alternating layers are applied by a PECVD (Plasma Enhanced Chemical Vapor Deposition) process.

6. The process as claimed in claim 1,
wherein the alternating layers are deposited by varying at least one process parameter and a plasma generated by means of microwaves is used for deposition of the layers with plasma generated by means of microwaves being pulsed,
wherein the process parameter(s) which is/are to be varied is/are selected from the group consisting of precursor concentration, mean microwave power, pressure, total flow rate, pulse power, pulse length and duration of interpulse period.

7. The process as claimed in claim 1, wherein a precursor concentration for application of the organic adhesion-promoter layer is in the range from 5% to 80% of the total flow and/or wherein the precursor concentration for application of the barrier layer is in the range from 0.5% to 4%.

8. The process as claimed in claim 1, wherein an interpulse period for the organic layer is in the range from 2 ms to 100 ms and for the inorganic layer is between 5 ms and 200 ms.

9. The process as claimed in claim 1, wherein the pulse power for the organic layer is in the range from 100 W to 5000 W or a pulse power for the second, inorganic layer is in the range from 100 W to 5000 W.

10. The process as claimed in claim 1, wherein a mean microwave power for the organic layer is in the range from 10 W to 5000 W, and/or the mean microwave power for the inorganic layer is in the range from 10 W to 5000 W.

11. The process as claimed in claim 1, wherein the substrate is a hollow body which is evacuated on the outside to a pressure $P_1$ and pumped down to a base pressure $P_2<P_1$ on the inside, the pressure $P_1$ being in the range from 10 to 50 mbar, and the base pressure $P_2$ being less than 1 mbar.

12. The process as claimed in claim 1,
wherein the substrate comprises an interior that is a hollow body which is evacuated on the outside to a pressure $P_1$ and pumped down to a base pressure $P_2<P_1$ on the inside,
wherein a gas mixture which contains a precursor is passed into the interior of the substrate at a pressure $P_3$, where $P_2<P_3<P_1$, the pressure $P_3$ lying in the range from 0.2 mbar to 1.0 mbar.

13. The process as claimed in claim 1,
wherein the substrate comprises an interior that is a hollow body which is evacuated on the outside to a pressure $P_1$ and pumped down to a base pressure $P_2<P_1$ on the inside,
wherein a gas mixture which contains a precursor is passed into the interior of the substrate at a pressure $P_3$, where $P_2<P_3<P_1$ and
wherein an overall flow and/or the pressure $P_3$ in an interior of the substrate during deposition of the inorganic barrier layer is at least equal to the overall flow and/or the pressure $P_3$ in the interior of the substrate during deposition of the organic adhesion-promoter layer.

14. The process as claimed in claim 1,
wherein the substrate is a hollow body which is evacuated on the outside to a pressure $P_1$ and pumped down to a base pressure $P_2<P_1$ on the inside and
wherein an overall flow and/or the pressure $P_3$ in an interior of the substrate during deposition of the inorganic barrier layer is at least equal to the overall flow and/or the pressure $P_3$ in the interior of the substrate during deposition of the organic adhesion-promoter layer and wherein the pressure $P_3$ for the first, organic layer is in the range from 0.1 mbar to 1.0 mbar and for the second, inorganic layer is in the range from 0.1 mbar to 1.0 mbar.

15. The process as claimed in claim 1, wherein a lance length is in the range from 5% to 80% of the height of a substrate which is to be coated.

16. The process as claimed in claim 1, wherein an overall flow rate for the organic adhesion-promoter layer is in the range from 10 sccm to 250 sccm and an overall flow rate for the inorganic layer is in the range from 200 sccm to 1000 sccm.

17. The process as claimed in claim 1,
wherein a plasma generated by means of microwaves is used for deposition of the layers and
wherein a process gas for a layer is in each case admitted at a pressure which is higher than the pressure immediately prior to an ignition of the plasma.

18. The process as claimed in claim 1, wherein the process pressure drops continuously during the application of a layer until the start of the application of the next layer.

19. The process as claimed in claim 1, wherein the temperature rises continuously during the application of the coating.

20. The process as claimed in claim 1, wherein a plasma continues to burn while the process parameters are being changed during a transition between two coating steps.

21. The process as claimed in claim 1, wherein a plasma is interrupted for a transition time, which is in the range from 0 to 1.0 s, while the process parameters are being changed during the transition between two coating steps.

22. The process as claimed in claim 1, wherein the transition time for a pulsed plasma is greater than the interpulse period.

23. The process as claimed in claim 1, wherein prior to the application of the coating a plasma pretreatment whose duration is below 5 s, is carried out.

24. The process as claimed in claim 1, wherein at least one process parameter is varied continuously.

25. The process as claimed in claim 1, wherein at least one process parameter is varied discontinuously.

26. The process as claimed in claim 1, wherein at least one process parameter is varied in one part continuously and in another part discontinuously.

27. The process as claimed in claim 1, wherein at least by means of the barrier layer a barrier action in order to reduce the permeability for oxygen is achieved by lengthening the diffusion paths.

28. The process as claimed in claim 1, wherein a gas mixture used for applying alternating layers by chemical vapor deposition contains oxygen and at least one silicon-containing organic compound.

29. The process as claimed in claim 1, wherein the process steps of applying a first and a second layer are repeated.

30. The process as claimed in claim 1, wherein the alternating layers are deposited on a dielectric material.

31. The process as claimed in claim 30, wherein the alternating layers are deposited on a dielectric material being a plastic material.

32. The process as claimed in claim 1, wherein the deposition rate for the organic layer is in the range from 120 nm/min to 5000 nm/min and/or a deposition rate for the inorganic layer is in the range from 60 nm/min to 2000 nm/min.

* * * * *